United States Patent [19]
Chang

[11] Patent Number: 4,794,320
[45] Date of Patent: Dec. 27, 1988

[54] MULTI-FREQUENCY CAPACITANCE SENSOR

[75] Inventor: Chih C. Chang, Huntingdon Valley, Pa.

[73] Assignee: Moore Products Co., Spring House, Pa.

[21] Appl. No.: 83,781

[22] Filed: Aug. 10, 1987

[51] Int. Cl.⁴ .......................................... G01R 27/26
[52] U.S. Cl. .............................. 324/60 CD; 324/61 R
[58] Field of Search .................. 307/110; 73/718, 724; 324/60 R, 60 C, 60 CD, 61 R

[56] References Cited

U.S. PATENT DOCUMENTS

| | | | |
|---|---|---|---|
| 2,937,369 | 12/1955 | Newbold et al. | 340/177 |
| 3,716,782 | 2/1973 | Henry | 324/61 R |
| 4,187,460 | 2/1980 | Dauge et al. | 324/60 CD |
| 4,193,063 | 3/1980 | Hitt et al. | 340/200 |
| 4,295,090 | 10/1981 | Ponkala | 324/60 CD |
| 4,295,091 | 10/1981 | Ponkala | 324/60 CD |
| 4,459,541 | 7/1984 | Fielden et al. | 324/60 CD |
| 4,481,465 | 11/1984 | Fredericks et al. | 324/60 CD |
| 4,633,168 | 12/1986 | Venema | 324/60 CD |

FOREIGN PATENT DOCUMENTS

WO85/01356 6/1984 PCT Int'l Appl.

*Primary Examiner*—Reinhard J. Eisenzopf
*Assistant Examiner*—Anthony L. Miele
*Attorney, Agent, or Firm*—Albert L. Free

[57] ABSTRACT

The ratio $C_1/C_2$ between the capacitances of two capacitors is obtained by connecting them into the frequency-determining circuit of an oscillator in at least three different combinations, namely $C_1$ along, $C_2$ along and both or neither of $C_1$ and $C_2$; the resultant oscillation frequencies are measured, and a signal representative of changes in $C_1/C_2$ is derived from the oscillator frequencies, preferably by means of digital circuitry. In one preferred mode $C_1/C_2$ is obtained by forming signals proportional to

$$\frac{f_1(f_2 - f_4)}{f_2(f_1 - f_4)} = \frac{T_4 - T_2}{T_4 - T_1},$$

and in another preferred mode proportional to $$\frac{f_2(f_3 - f_1)}{f_1(f_3 - f_2)} = \frac{T_1 - T_3}{T_2 - T_3}.$$

In still another preferred mode $C_1/C_2 - 1$ is obtained from the expression $T_1 - T_3/T_2 - T_3$ and used as the indication of changes in $C_1/C_2$. In the foregoing, $f_1$, $f_2$, $f_3$ and $f_4$ are the oscillator frequencies produced respectively by connecting $C_1$ alone, $C_2$ along, neither $C_1$ nor $C_2$, and both $C_1$ and $C_2$ into the frequency-determining circuit, and $T_1$, $T_2$, $T_3$ and $T_4$ are the periods of oscillations at $f_1$, $f_2$, $f_3$ and $f_4$ respectively.

4 Claims, 3 Drawing Sheets

MULTI-FREQUENCY CAPACITANCE SENSOR

BACKGROUND OF THE INVENTION

This invention relates to an electrical method and apparatus for providing indications of capacitance values, and particularly to such method and apparatus for measuring the ratio between the capacitances $C_1$ and $C_2$ of two capacitors.

As an example, it is known to measure pressure in a fluid byuusing a fixed capacitor and another capacitor subject to a variable pressure, and sensing changes in the ratio of the capacitances of the two capacitors. In other cases the two capacitances are arranged to change in opposite directions in response to a physical parameter such as pressure. There are other known situations as well in which it is desired to measure such ratio between the values of two capacitors. Typically the two capacitance values are nearly equal at some point in their expected range of variation in value, so that extraneous factors tending to affect the value of $C_1/C_2$ will be to a great extent cancelled out when the ratio $C_1/C_2$ is formed.

One general method wiich may be employed to measure $C_1/C_2$ (or, equivalently, $C_2/C_1$) is to place $C_1$ and $C_2$ alternately into a position in an oscillator circuit in which the capacitor affects the frequency of oscillation, preferably so that changes in the oscillation frequency are substantially inversely proportional to the value of the capacitance placed in the circuit. By using the same circuit to generate the oscillations for both capacitors, and by switching the capacitors in and out of the circuit frequently and rapidly, sources of error other than noise and drift of circuit component values are to some extent eliminated; by deriving a signal proportional to the ratio of the values $C_1$ and $C_2$, the effects of drifts in circuit parameters, such as resistances and amplifier gains, are reduced.

However, in such circuits there is always present some additional fixed capacitance, here designated $C_p$, continuously present in the circuit and affecting the frequency of oscillation. $C_p$ determines the frequency of oscillations which occur in the absence of both $C_1$ and $C_2$, and as used herein includes not only stray circuit capacitances but also any fixed lumped capacitance continuously present in the circuit. Accordingly, the foregoing procedures serve not to measure $C_1/C_2$, but instead measure $C_1+C_p/C_2+C_p$. The latter ratio is not in general the desired ratio $C_1/C_2$, and inaccuracy therefore results, especially where the values of $C_1$ and $C_2$ are small. In addition, in such cases the ratio will have an unpredictable temperature coefficient of span or gage factor, due to the unpredictable temperature coefficient of $C_p$.

It is therefore an object of the invention to provide a new and useful method and apparatus for providing electrical indications of the ratio between the capacitances $C_1$ and $C_2$ of a pair of capacitors.

Another object is to provide such method and apparatus which are accurate and reliable.

A further object is to provide such method and apparatus which are economical to make and use.

SUMMARY OF THE INVENTION

In accordance with the invention, a method and apparatus are provided for measuring the ratio between the capacitance values $C_1$ and $C_2$ of a pair of capacitors by intermittently connecting the capacitors into an active position in the frequency-determining circuit of an oscillator in various combinations; at one time one capacitor is connected into the active frequency-determining position to cause oscillation at a frequency $f_1$, at another time the other capacitor is so connected to produce an oscillator frequency $f_2$, and at still another time neither or both of the capacitors are so connected to produce another oscillator frequency $f_3$ (if neither connected) or $f_4$ (if both connected).

From the three oscillator signals of frequencies $f_1$, $f_2$, and $f_3$ or $f_4$ there is derived a signal value representative of the ratio between $C_1$ and $C_2$, as desired. This ratio value is substantially free of errors due to parasitic capacitance, yet the apparatus and method are simple, reliable, and economical to make and use.

The embodiment of the invention which uses the frequency $f_3$, produced by making both capacitors inactive in the oscillator circuit, will be designated herein as the $M_3$ mode, and that which uses the frequency $f_4$ produced by connecting both capacitors actively in the frequency-determining circuit, as the $M_4$ mode. At the present time the $M_4$ mode is preferred for applicant3 s purposes.

As will be demonstrated hereinafter, the capacitance ratio using the $M_4$ mode is given by either of the following equivalent expressions:

$$C_1/C_2 = \frac{f_1(f_2 - f_4)}{f_2(f_1 - f_4)} = \frac{T_4 - T_2}{T_4 - T_1}, \qquad (1)$$

where $T_1$, $T_2$, $T_4$ are the cycle periods of the oscillations at $f_1$, $f_2$ and $f_4$ respectively. Accordingly, one may produce the desired signal value representing $C_1/C_2$ by apparatus which forms the difference $(f_2-f_4)$, multiplies it by $f_1$, forms the difference $(f_1-f_4)$, multiplies it by $f_2$, and then forms the quotient shown at (1) above. Or, more easily in many cases, the periods $T_4$, $T_2$ and $T_1$ are measured, signals representing the numerator $(T_4-T_2)$ and the denominator $(T_4-T_1)$ formed, and the numerator divided by the denominator, as also indicated in expression (1) above. The latter procedure is presently preferred for its ease of implementation.

In the $M_3$ mode, $$C_1/C_2 = \frac{f_2(f_3 - f_1)}{f_1(f_3 - f_2)} = \frac{T_1 - T_3}{T_2 - T_3}. \qquad (2)$$

Again, while apparatus for obtaining the value of $C_1/C_2$ may calculate either the frequency-containing expression or the expression in terms of the period T, the latter is presently preferred.

The oscillator circuit presently preferred for these pusposes employs an inverting hysteresis circuit with its output fed back to its input through a non-inverting amplifier having unity gain; the capacitors to be measured are connectable between the input and the output of the amplifier (inactive position) or between the input of the amplifier and circuit ground (active position). In the preferred embodiment, the capacitors are automatically and cyclically switched into and out of their active positions, and the durations T of the cycles of the resultant oscillator signals at three different frequencies are measured from which the signal value $$\frac{T_4 - T_2}{T_4 - T_1}$$

representing $C_1/C_2$ is derived.

THEORY OF THE INVENTION

The theory of the invention is as follows.

The frequency of the oscillator is inversely proportional to the active capacitance in the frequency-determining position in the oscillator circuit—in the preferred example, between the amplifier input and circuit common or ground. If there were no parasitic capacity, one could alternately switch $C_1$ and $C_2$ into the active position, and measure the corresponding frequencies $f_1$ and $f_2$, or the periods $T_1$ and $T_2$. $C_1/C_2$ would then equal $f_2/f_1$, or $T_1/T_2$ (times an appropriate scaling factor).

However, parasitic capacity is present, and can be represented by a capacitance $C_p$ added to the active capacitance. The effective capacitances are then $C_1+C_p$ and $C_2+C_p$, and their ratio $C_1+C_p/C_2+C_p$ is not the same as the desired ratio $C_1/C_2$. The corresponding actually-measured ratio's $f_2/f_1$ and $T_1/T_2$, in a two frequency system, therefore do not represent $C_1/C_2$ accurately because of the effects of $C_p$.

However, in accordance with the teachings of this invention, the two capacitors are capable of being connected actively in the circuit in any of four combinations, with the results as shown in the following Table:

| Active | Inactive | Equation for T |
|---|---|---|
| $C_1$ | $C_2$ | $T_1 = 1/f_1 = (C_1 + C_p)KR$ |
| $C_2$ | $C_1$ | $T_2 = 1/f_2 = (C_2 + C_p)KR$ |
| — | $C_1 + C_2$ | $T_3 = 1/f_3 = C_p KR$ |
| $C_1 + C_2$ | — | $T_4 = 1/f_4 = (C_1 + C_2 + C_p)KR$ |

In the above, R represents the resistive parameters in the oscillator circuit and K represents the other constant circuit parameters determining the frequency of oscillation. $C_p$ is as defined previously. In the above expressions K, R and $C_p$ are assumed to be constant.

Using the first three of the above-listed conditions, by algebraic manipulation it can be shown that:

$$C_1/C_2 = (T_1-T_3)/(T_2-T_3) = f_2(f_3-f_1)/f_1(f_3-f_2) \quad (3)$$

Using the first two and the fourth relations in the Table above, $$C_1/C_2 = (T_4-T_2)/(T_4-T_1) = f_1(f_2-f_4)/f_2(f_1-f_4). \quad (4)$$

Any one of the four expressions for $C_1/C_2$ given above may be used to obtain the desired signal value for $C_1/C_2$. The expression $(T_4-T_2)/(T_4-T_1)$ in the $M_4$ mode is presently preferred. It is not only easy to implement, but also is more likely to produce better compensation, since $f_4$ (produced with both $C_1$ and $C_2$ active) is a lower frequency than $f_3$ (produced by neither $C_1$ nor $C_2$ active), and hence the values of KR and $C_p$ will be more nearly exactly constant for the three frequencies $f_1$, $f_2$ and $f_4$, as desired for good compensation.

BRIEF DESCRIPTION OF FIGURES

These and other objects and features of the invention will be more readily understood from a consideration of the following detailed description, taken with the accompanying drawings, in which.

DETAILED DESCRIPTION OF SPECIFIC EMBODIMENTS

Figure 1:
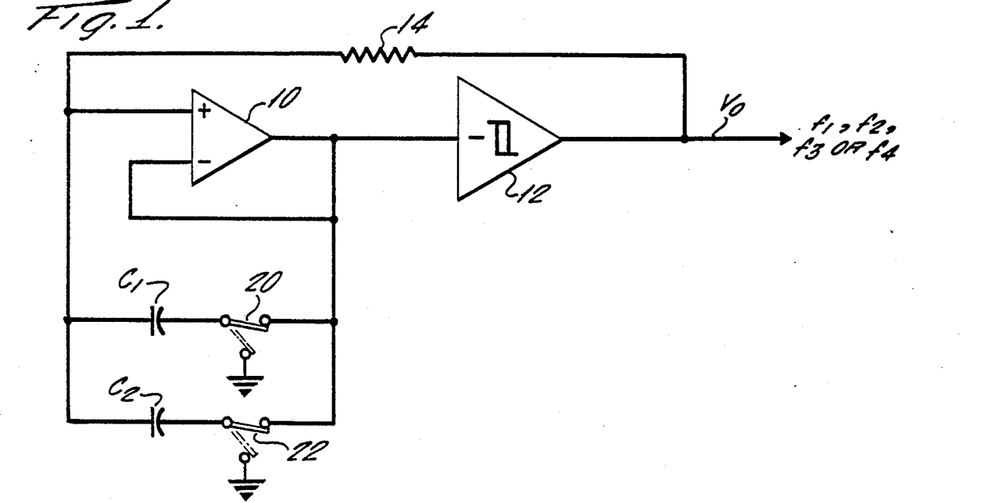
FIG. 1 is a broad diagrammatic representation of a system embodying the invention.

Referring first to FIG. 1 which illustrates certain basic aspects of the invention in broad outline, there is shown a multi-mode oscillator (MMO) capable of oscillating at any of four frequencies $f_1$, $f_2$, $f_3$ or $f_4$, depending upon whether capacitor $C_1$, capacitor $C_2$, neither capacitor, or both capacitors are actively connected in the frequency-determining circuit.

More particularly, the oscillator comprises a non-inverting operational amplifier 10 having unity gain by virtue of the direct connection of its output to its minus (inverting) input terminal; an inverting bistable hysteresis amplifier 12 is supplied with the output of the non-inverting amplifier 10, and the output of the bistable amplifier is fed back through a feed back resistance 14 to the plus (non-inverting) input terminal of amplifier 10.

Figure 1A:
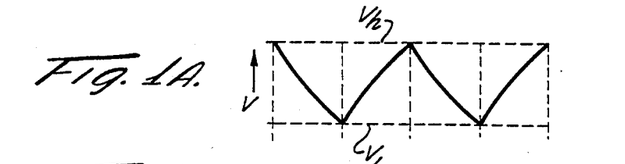
FIGS. 1A and 1B are graphs of waveforms in the circuit of FIG. 1.
Figure 1B:
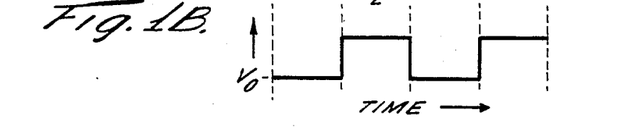

The frequency-determining circuit in this embodiment is that extending between the plus input terminal of the amplifier 10 and circuit ground or common, i.e. the same ground to which the two amplifiers are returned. The value of capacitance connected in this position controls the frequency of oscillation of the oscillator, the greater the capacitance the lower the frequency. More particularly, the feedback resistance and the capacitance provide an integrator action such that the voltage V at the input to the bistable amplifier increases at a rate determined by the capacitance actively connected into the circuit, until it reaches a trigger level of voltage $V_h$ at which the bistable amplifier is triggered to its opposite state, whereupon its input voltage falls to a minimum level $V_L$. This input variation is shown in FIG. 1A. The corresponding output voltage of the bistable amplifier is a generally rectangular wave which switches between its high and low levels in synchronism with the above-described input waveform, as shown in FIG. 1B.

The amount of frequency-controlling capacitance actively connected in the frequency-determining circuit is controlled by two independent single-pole, double-throw switches 20 and 22 which control the connection to ground of the sides of capacitors $C_1$ and $C_2$ opposite from the sides which are connected to the plus input terminal of amplifier 10. By operating these switches to their various combinations of positions, either $C_1$ or $C_2$, or neither or both, may be actively connected into the frequency-determining circuit to determine the frequency of the oscillator. Such switching is typically done by appropriate electronic switches. In this way the output pulse waveform shown in FIG. 1B may be provided at the frequencies $f_1$, $f_2$ and either $f_3$ or $f_4$ as desired.

Figure 2:
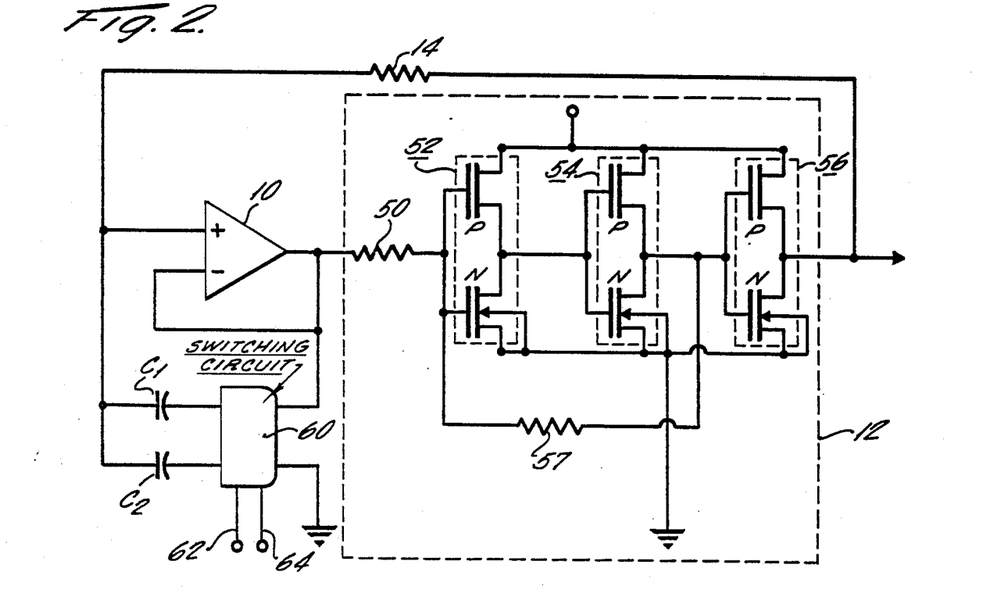
FIG. 2 is a more detailed schematic diagram of a multi-mode oscillator as used in a preferred form of the invention.

FIG. 2 shows in more detail the presently-preferred circuit for use in the general system of FIG. 1, and corresponding parts are designated by corresponding numerals. In FIG. 2, the bistable hysteresis amplifier 12 comprises a series input resistor 50 and three CMOS complementary pairs 52, 54 and 56 connected in tandem; a feedback resistor 57 is connected between the input terminal of the first CMOS pair 52 and the output of the second CMOS pair 54. The output of the third CMOS pair 56 is connected bac to the plus input terminal of amplifier 10 through feedback resistor 14. The third CMOS pair serves as a inverter and as a low-impedance output driver The connecting of the capacitors $C_1$ and $C_2$ in and out of theee active positions in the frequency-determining circuit is effected by a conventional commercially-available CMOS dual single-pole, double-throw switch 60, controlled by the two mode control lines 62 and 64, so as to connect $C_1$ or $C_2$, neither of them, or both of them, to ground (active position); that capacitor at any time not connected to ground is instead connected to the output of amplifier 10 and is inactive so far as affecting frequency is concerned, since the amplifier exhibits unity gain.

In FIG. 2, as an example only, when measuring values of $C_1$ and $C_2$ of the order of 15 picofarads, resistor 14 may have a value of about 6 megohms, resistor 50 a value of about 0.25 megohm, and resistor 57 a value of about 1 megohm.

Figure 3:
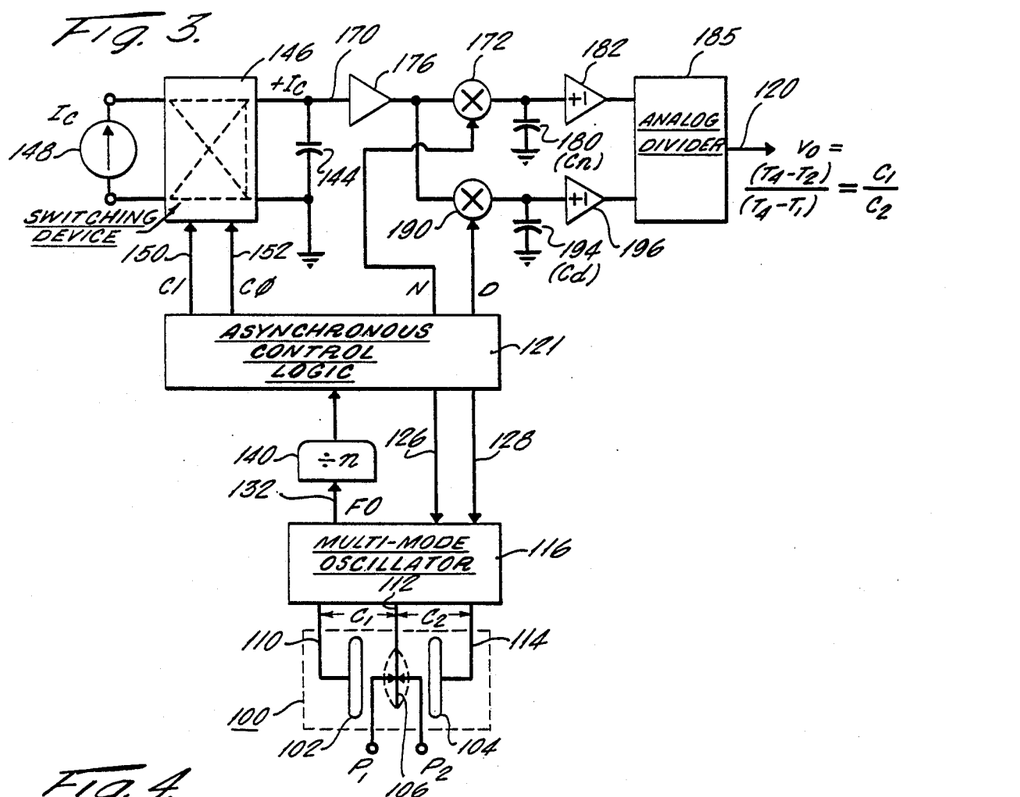
FIG. 3 is a schematic diagram showing in more detail a preferred form of the arrangement for converting the oscillations at three frequencies into an analog signal representing the ratio between the capacitances $C_1$ and $C_2$ of the two capacitors.
Figure 4:
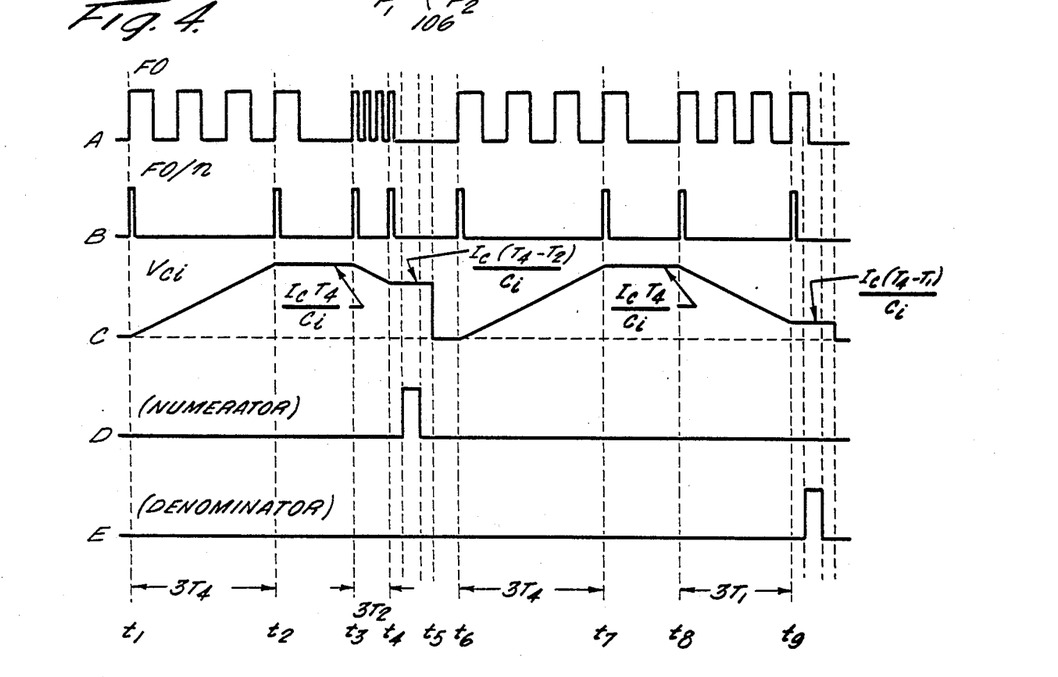
FIG. 4 is a timing diagram showing, at A through E, five waveforms produced at five points in the system of FIG. 3, to a common horizontal time scale.

Turning now to FIGS. 3 and 4, the manner in which these output signals are processed to derive a signal value representing $C_1/C_2$ will now be described in detail. FIG. 3 shows schematically a conventional capacitive sensor 100 made up of two capacitor plates 102 and 104 between which is mounted a flexible central plate 106 exposed on one side to a pressure $P_1$ and on the other side to a pressure $P_2$. When $P_1$ and $P_2$ are equal, the central plate is flat and half way between the two outer plates 102 and 104. When $P_1$ and $P_2$ differ, the central plate bows toward one or the other outer plate dependent upon weather $P_1$ or $P_2$ is greater, as shown by the curved broken lines in the drawing. In this case $C_1$ is the capacitance between the central plate 106 and outer plate 102, and $C_2$ is the capacitance between the central plate and the outer plate 104, the ratio $C_1/C_2$ being 1 when $P_1=P_2$, greater than 1 when the central plate bulges toward outer plate 102, and less than 1 when it bulges toward outer plate 104. Capacitive sensors operating on this principal are well known in the art for measuring fluid pressures, for example.

The leads 1IO, 112 and 114 from the outer plate 102, the central plate 106 and the outer plate 104, respectively, connect $C_1$ and $C_2$ to the MMO (multi-mode oscillator) 116 which is shown in detail in FIGS. 1 and 2.

The overall function of the system of FIG. 3 is to produce an analog signal level on output line 120 which represents the ratio $C_1/C_2$, which as explained above equals $(T_4-T_2)/(T_4-T_1)$. The timing and sequencing for the system is controlled by the ACL (Asynchronous Control Logic) 121. Two of the ACL outputs, on lines 126 and 128, are the two bits which control the sequential and repetitive connection of the capacitances $C_1$ and $C_2$ into active positions on the frequency-determining circuit of the MMO, in this preferred embodiment thereby producing at the output line 132 of the MMO the three sequential frequencies $f_1$, $f_2$ and $f_4$, as described previously.

In order to measure more easily and accurately the periods $T_1$, $T_2$ and $T_4$ of the oscillators at frequencies $f_1$, $f_2$ and $f_4$, it is preferred to divide all such frequencies by a constant factor n, thereby to obtain longer periods T for measurement. In this example it is assumed that a frequency divider 140 divides the frequencies by a factor $n=3$, before supplying them to the ACL. This scaling-up of the periods T by a factor of 3 is cancelled out in the final output signal from the system.

The scheme for forming the numerator $T_4-T_2$ and the denominator is as follows. A capacitor 144 is connected through a switching device 146 to a constant-current source 148 of conventional form. The switching device has four states: one in which the constant-current source charges capacitor 144 with a constant current $I_c$; a second in which capacitor 144 is discharged (charged negatively) with a constant current $-I_c$; a third in which the capacitor is open-circuited so as to retain its charge; and a fourth in which the capacitor is short-circuited to reset its charge to zero. Which state it assumes is controlled by the two bits of control infommation supplied to switching device 146 over lines 150 and 152.

When $3T_4$ is oo be measured (and thereby the period $T_4$), the control bits place the switching device in its first state in which the initially discharged capacitor 144 is charged by the constant current $I_c$ for the time $3T_4$ to be measured, and the voltage to which the capacitor charges in that time is a measure of $3T_4$. When $T_2$, or $T_1$, is to be subtracted from $T_4$, the control bits change the switching device 146 to its second state in which the capacitor is discharged by the reverse constant current $-I_c$ for the duration $3T_1$ (or $3T_2$) and the voltage in the capacitor decreases fromiits $3T_4$ level to a level representing $3(T_4-T_2)$ [or $3(T_4-T_1)$]. The levels $3(T_4-T_2)$ and $3(T_4-T_1)$ are separately supplied to an analog divider which calculates the desired ratio $(T_4-T_2)/(T_4-T_1)=C_1/C_2$.

The nature and operation of the portion of the system of FIG. 3 which forms the numerator and denominator representing signals will be more easily understood by considering FIG. 3 with relation to the timing diagram of FIG. 4.

In FIG. 4, it is assumed that, at time $t_1$, the capacitor 144 has been reset to zero by being changed to its fourth state by the control bits on lines 150,152, and that at this time the start of a cycle of the $f_4/3$ signal in the ACL causes switching device 146 to change to its charging state. The signals at $f_1$, $f_2$ and $f_4$ are shown at A in FIG. 4, while the signals at $f_1/3$, $f_2/3$ and $f_4/3$ are shown at B. The value of capacitor 144 is designated as $C_i$.

FIG. 4c shows the voltage level on capacitor 144, designated as $V_{ci}$. At $t_1$, it begins to be charged with a current $I_c$, and continues to charge linearly upwardly until $t_2$, when the period $3T_4$ ends and the switching device 146 changes to its opencircuit state in which capacitor 144 holds its charge constant at a level proportional to $I_c T_4/C_i$.

At $t_2$, the ACL then switches the MMO to its $f_2$ oscillation frequency ($C_2$ connected actively), corresponding to a period $T_2$. The system remains in this state until $t_3$, allowing the circuits to stabilize a the new frequency $f_2$.

The next pulse of $f_2/3$ frequency causes switching device 146 to switch to the state in which it supplies a constant current $-I_c$ to capacitor 144, thus discharging capacitor 144 until the end of the interval $3T_2$, which occurs at $t_4$. This results in a decrease of the voltage in capacitor 144 by an amount proportional to $I_cT_2/C_i$, and accordingly the level on that capacitor at $t_4$ becomes proportional to $I_c(T_4-T_2)/C_i$. The switching device then switches to its open-circuit state in which it remains, holding the latter value of voltage, until the ACL causes the switching device to reset the capacitor 144 to its zero-charge condition at $t_5$.

During the interval $t_4$ to $t_5$, the ACL produces the transfer pulse shown at D of FIG. 4, which is applied to a normally non-transmissive gate 172 to render it momentarily transmissive, whereby the voltage level on capacitor 144 representing the numerator of the desired ratio is transferred through high-input impedance unity-gain non-inverting operational amplifier 176 to capacitor 180, which stores the present value proportional to $I_c(T_4-T_2)/C_i$. The latter stored value is applied through unity-gain non-inverting operational amplifier 182 to the numerator input terminal of a conventional analog divider 185, which may be a National type LH0094 Multi-Function IC using the logarithmic characteristics of a diode to generate an output voltage proportional to its numerator input divided by its divisor input.

After this transfer of voltage to capacitor 180, the resetting of capacitor 144 to zero charge occurs, and the process is repeated except that the interval between $t_8$ and $t_9$ in FIG. 4C is proportional to $T_1$ rather than $T_2$, so that the voltage level on the capacitor 144 becomes proportional to $I_c(T_4-T_1)/C_i$. Also, the latter voltage is passed through gate 190 during the denominator pulse shown in FIG. 4E and generated by the ACL, to be stored on capacitor 194 and supplied through operational amplifier 196 to the denominator input of divider 185, whereby the output of the divider on line 120 becomes $(T_4-T_2)/(T_4-T_1)$, as desired.

In a typical application of the invention, the sensing capacitances $C_1$ and $C_2$ have values of the order of tens of picofarads, $f_1$ and $f_2$ about 8 KHz, and $f_4$ about 3 KHz; if the $M_3$ mode is used, $f_3$ may have a value of about 15 KHz.

In some cases it may be desirable intentionally to include a fixed, continuously-present capacitance in the frequency-determining circuit, for example by connecting a fixed capacitor continuously between the plus input and the output of the unity-gain amplifier 10. This will shift the values of $f_1$, $f_2$, $f_3$ and $f_4$ downwardly, but the system will still operate as described to produce proper output indications of $C_1/C_2$; the lumped capacitance acts the same as stray capacitance, and is therefore considered herein as a part of $C_p$.

The above described apparatus can just as easily be used to compute th capacitance ratio in the M3 mode by appropriate substitution of variables $T_1$, $T_2$, and $T_3$. Specifically referring to FIG. 4, if $3T_1$ is substituted for the time period $t_1$ to $t_2$, $3T_3$ for $t_3$ to $t_4$, $3T_2$ for $t_6$ to $t_7$, and $3T_3$ for $t_8$ to $t_9$, then the resultant output will be $(T_1-T_3)/(T_2-T_3)$ as would be desired for M3 operation.

In general the apparatus of FIG. 3 can be used to compute the result of any expression which is in the form of the quotient of two different terms. A useful variation of the M3 and M4 expressions is to subtract 1 from them so that the result is zero based. For example, in the design of capacitive pressure sensors, $C_1$ and $C_2$ are typically equal at null conditions and the desired output is zero, increasing in a positive direction for positive pressure and decreasing in a negative direction for negative pressure. When 1 is subtracted from either the M3 or M4 expressions the resultant general form of the equation remains the same and can thus be computed by the apparatus of FIG. 3 by appropriate substitution of terms. Specifically the zero based expression for M3 becomes:

$$(T_1-T_2)/(T_2-T_3),$$

and for M4 becomes:

$$(T_1-T_2)/(T_4-T_1).$$

Figure 5:
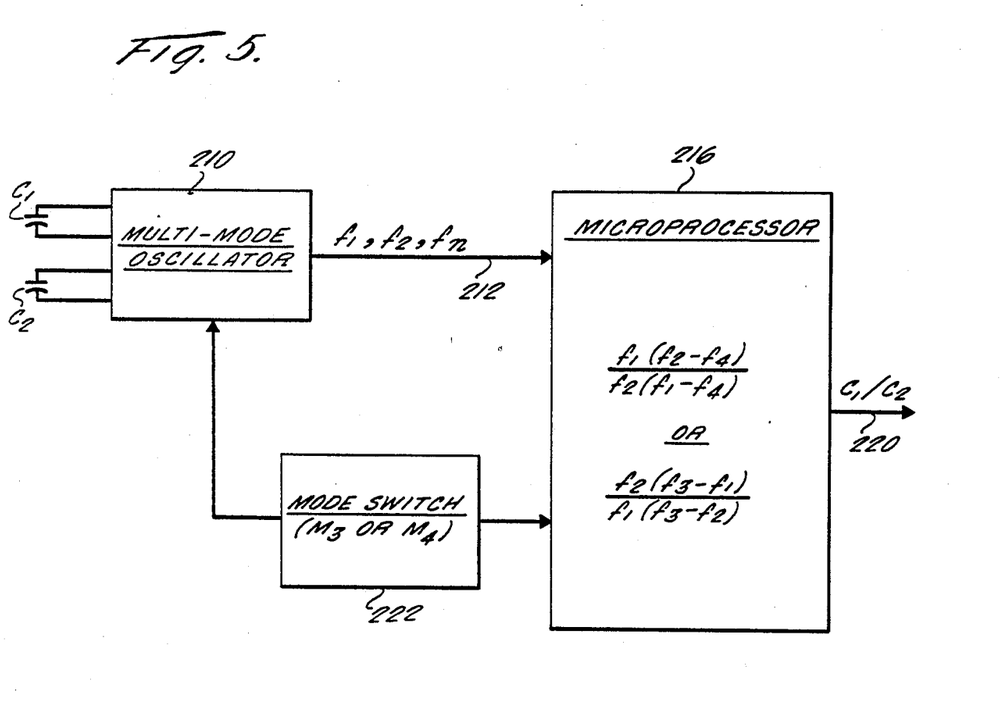
FIG. 5 is a block diagram illustrating another form of embodiment of the invention which is preferred for certain purposes.

If it is desired to use the M3 or M4 modes in the forms involving frequencies rather than periods [see expressions (1) and (2) above], this is preferably done by using a programmed microprocessor supplied with the several different frequencies produced by the MMO. Such an arrangement is shown in FIG. 5. A multi-mode oscillator 210, connected to $C_1$ and $C_2$ as described with reference to FIGS. 1, 2 and 3, produces signals of the several different frequencies on its output line 212. The latter signals are supplied to a programmed microprocessor 216, which in turn produces an output signal proportional to $C_1/C_2$ on its output line 220.

Although the arrangement of FIG. 5 can be used to provide operation in only the M3 mode, or in only the M4 mode, in this example it is shown as permitting the operator to use either mode M3 or M4 as desired. To this end a manually-operable mode switch 222 is provided for actuating the system to either mode; the mode switch is connected to the MMO to cause it to produce either $f_1$, $f_2$ and $f_3$ or $f_2$, $f_2$ and $f_4$, as desired, and simultaneously to switch the microprocessor to the corresponding program for M3 or M4.

The necessary subtractions, multiplications or divisions necessary to be performed by the microprocessor can be performed by conventional known apparatus and need not be described in detail herein. While the conversion of the output signals of the MMO to signals proportional to their frequencies can be accomplished by analog devices such as phase-locked loop circuits, positioned between MMO and microprocessor, it is preferred to perform this step also in the microprocessor, which is easily and conventionally accomplished, for example by counting the number of clock pulses recurring within a cycle of each signal. It will be appreciated that there are many ways in which the formulas given above can be digitally evaluate by the microprocessor, any of which are satisfactory so long as they produce the proper output value representative of changes in $C_1/C_2$.

While the invention has been described with particular reference to specific embodiments in the interest of complete definiteness, it will be understood that it may be embodied in a varietY of forms diverse from those specifically shown and described without departing from the spirit and scope of the invention as defined by the appended claims

What is claimed is:

1. A system for producing a signal value representative of the ratio between the capacitance $C_1$ of a first capacitor and the capacitance $C_2$ of a second capacitor, comprising:

oscillator means having a frequency-determining circuit and oscillating at a frequency which varies in a predetermined manner with the total value of capacitance actively connected in said circuit;

said frequency-determining circuit inherently including a continuously-present capacity $C_p$ determining the frequency of oscillations of said oscillator means in the absence of said capacitors $C_1$ and $C_2$;

said first and second capacitors having four possible combinations in which they could be connected to said frequency-determining circuit, namely;

(1) only said first capacitor actively connected in said circuit;

(2) only said second capacitor actively connected in said circuit;

(3) neither of said first and second capacitors actively connected in said circuit;

(4) both said first and second capacitors actively connected in said circuit;

switching means connecting said first and second capacitors with said frequency-determining circuit in said combination (1) at a first time to produce oscillations at a first frequency $f_1$, connecting said first and second capacitors with said circuit at another time in said combination (2) to produce oscillations at a second frequency $f_2$, and connecting said first and second capacitors with said frequency-determining circuit at still another time in one of said combinations (3) and (4) to produce oscillations at one of two corresponding different frequencies $f_3$ and $f_4$; and means responsive to said oscillations at frequencies $f_1$, $f_2$ and one of said frequencies $f_3$ and $f_4$ to produce signal values representative of the values of said ratio between $C_1$ and $C_2$, substantially undistorted by the effects of said capacitance $C_p$.

2. The system of claim 1, wherein said capacitors $C_1$ and $C_2$ are connected with said frequency-determining circuit sequentially in said combinations (1), (2) and (3), and said means responsive to said oscillations produce signal values representative of $(T_1-T_3)/(T_2-T_3)$, where $T_1$, $T_2$ and $T_3$ are the periods of the cycles of oscillations at frequencies $f_1$, $f_2$, and $f_3$, respectively.

3. The system of claim 1, wherein said capacitors $C_1$ and $C_2$ are connected with said frequency-determining circuit sequentially in said combinations (1), (2) and (4), and said means responsive to said oscillations produces signal values representative of $(T_4-T_2)/(T_4-T_1)$, where $T_1$, $T_2$ and $T_4$ are the periods of the cycles of oscillations at frequencies $f_1$, $f_2$ and $f_4$.

4. The system of claim 1, wherein said frequency of said oscillator means varies substantially inversely proportionally to said total value of capacitance actively connected in said circuit.

* * * * *

UNITED STATES PATENT AND TRADEMARK OFFICE
CERTIFICATE OF CORRECTION

PATENT NO. : 4,794,320

DATED : December 27, 1988

INVENTOR(S) : Chih Chen Chang

It is certified that error appears in the above-identified patent and that said Letters Patent is hereby corrected as shown below:

Column 1, line 11, change "byuusing" to --by using--.

Column 1, line 24, change "wiich" to --which--.

Column 2, line 24, change "applicant3s" to --applicant's--.

Column 3, line 26, change "two frequency" to --two-frequency--.

Column 5, line 16, change "bac" to --back--.

Column 5, line 19, a period should appear after "driver".

Column 5, line 21, change "theee" to --these--.

Column 5, line 54, change "1O4" to --104--, (middle symbol is a zero, not a letter O).

Column 5, line 57, change "1I0" to --110--.

Column 5, line 58, change "1O6" to "106, and change "1O4" to --104--.

Column 5, line 64, change "$C_i 1/C_2$" to --$C_1/C_2$--.

Column 6, line 41, change "fromiits" to read --from its--.

Column 6, line 63, change opencircuit" to --open-circuit--.

UNITED STATES PATENT AND TRADEMARK OFFICE
CERTIFICATE OF CORRECTION

PATENT NO. : 4,794,320

DATED : December 27, 1988

INVENTOR(S) : Chih Chen Chang

It is certified that error appears in the above-identified patent and that said Letters Patent is hereby corrected as shown below:

Column 7, line 59, change "th" to --the--.

Column 8, line 39, change "$f_2$" (first occurrence) to --$f_1$--.

Column 8, line 55, change "evaluate" to --evaluated--.

Column 8, line 62, change "varietY" to --variety--.

Signed and Sealed this

Nineteenth Day of June, 1990

Attest:

HARRY F. MANBECK, JR.

*Attesting Officer*     *Commissioner of Patents and Trademarks*

UNITED STATES PATENT AND TRADEMARK OFFICE
CERTIFICATE OF CORRECTION

PATENT NO. : 4,794,320
DATED : December 27, 1988
INVENTOR(S) : Chih Chen Chang

It is certified that error appears in the above-identified patent and that said Letters Patent is hereby corrected as shown below:

<u>In the Abstract, line 4 thereof</u>, change "along, $C_2$ along" to --alone, $C_2$ alone--;

<u>line 7 from bottom</u>, change "$T_1-T_3/T_2-T_3$" to --$(T_1-T_3)/(T_2-T_3)$--;

<u>line 4 from bottom</u>, change "along" to --alone--.

<u>Column 1, line 48</u>, change "$C_1+C_p/C_2+C_p$" to --$(C_1+C_p)/(C_2+C_p)$--.

<u>Column 3, line 22</u>, change "$C_1+C_p/C_2+C_p$" to --$(C_1+C_p)/(C_2+C_p)$-- (both occurrences).

<u>Column 7, line 52</u>, delete "output of the unity-gain amplifier 10" and insert --circuit ground--.

Signed and Sealed this

Twenty-ninth Day of September, 1992

Attest:

DOUGLAS B. COMER

Attesting Officer     Acting Commissioner of Patents and Trademarks